United States Patent [19]

Checki, Jr.

[11] 4,190,735

[45] Feb. 26, 1980

[54] SEMICONDUCTOR DEVICE PACKAGE

[75] Inventor: Angelo Checki, Jr., Lyndhurst, N.J.

[73] Assignee: RCA Corporation, New York, N.Y.

[21] Appl. No.: 884,700

[22] Filed: Mar. 8, 1978

[51] Int. Cl.² ............................................. H05K 5/06
[52] U.S. Cl. .............................. 174/52 FP; 174/52 S; 357/74; 357/80
[58] Field of Search .............. 174/52 FP, 52 S, 52 R; 357/74, 80; 333/84 M; 220/4 E

[56] References Cited

U.S. PATENT DOCUMENTS

| | | | |
|---|---|---|---|
| 929,865 | 8/1909 | Mahoney | 220/4 E |
| 3,146,410 | 8/1964 | Butler | 333/84 M X |
| 3,410,582 | 11/1968 | Appleton | 174/65 R X |
| 3,548,076 | 12/1970 | Cooke | 174/52 FP |
| 3,562,404 | 2/1971 | Satriano | 174/52 PE |
| 3,601,667 | 8/1971 | Desmond | 174/52 FP X |
| 3,937,389 | 2/1976 | Wind | 220/4 E |
| 4,067,040 | 1/1978 | Tsuzuki et al. | 357/80 X |

Primary Examiner—Bruce A. Reynolds
Assistant Examiner—D. A. Tone
Attorney, Agent, or Firm—H. Christoffersen; D. S. Cohen; R. Ochis

[57] ABSTRACT

A semiconductor device package comprises a plurality of walls extending from a base member which has a pellet mounting surface associated therewith. The walls form an enclosure and each one of the walls has a lid receiving surface associated therewith. All of the lid receiving surfaces lie in a single geometric plane which intersects the geometric plane of the pellet mounting surface at an included angle of less than about 90°. External leads protrude into the enclosures through one of the walls. A lid can be affixed to the lid receiving surfaces to hermetically seal the enclosure. The package is particularly useful when made to conform to the dimensions of the well known TO-220 package.

18 Claims, 4 Drawing Figures

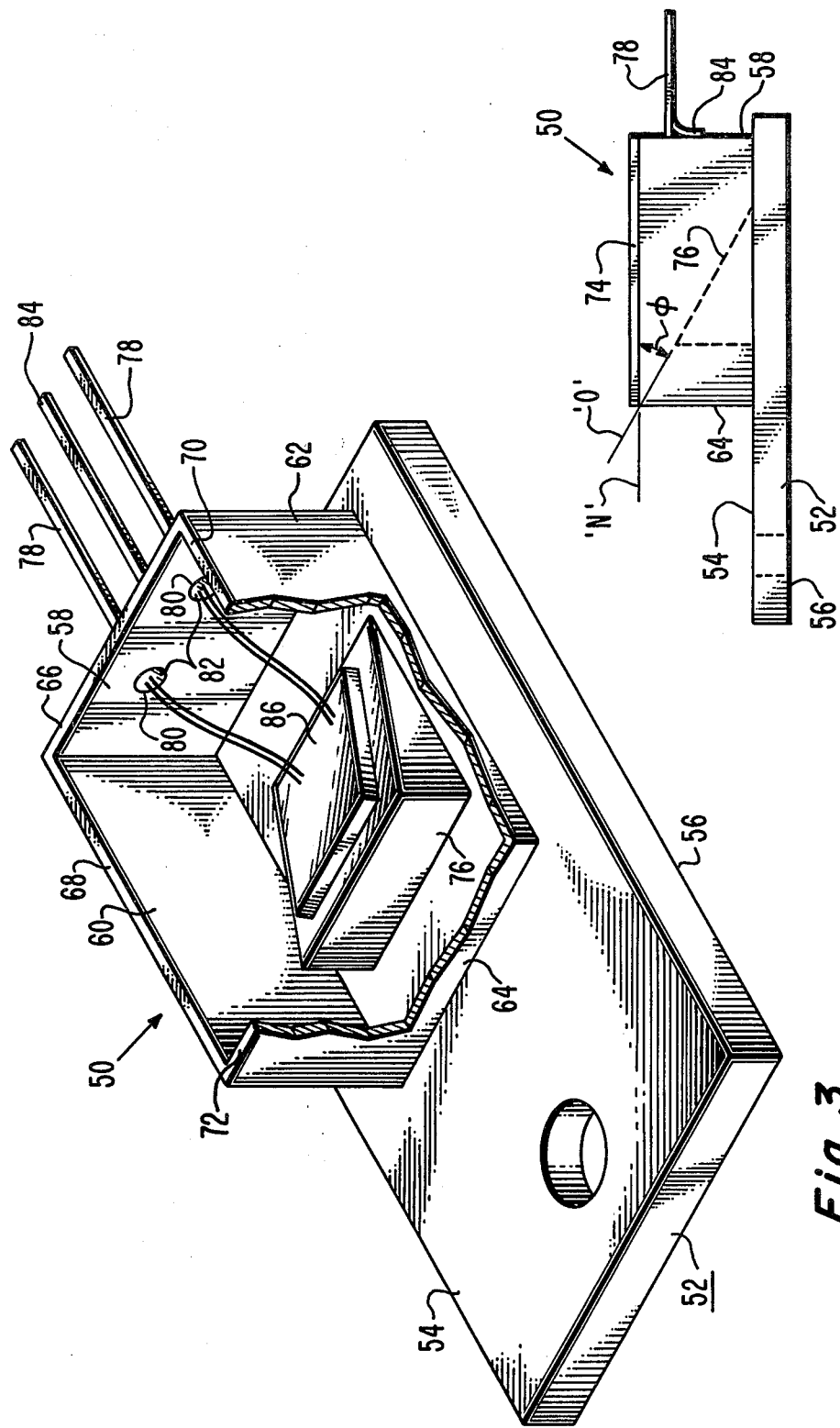

SEMICONDUCTOR DEVICE PACKAGE

The present invention generally relates to semiconductor packages and, in particular, to hermetically sealable packages conforming to the dimensional characteristics of the well known TO-220 package.

While semiconductor devices are generally mounted in packages having various configurations, one particular configuration is the well known TO-220. In this configuration external leads extend substantially parallel to, but in a different plane than a base member of the package. Usually the base member is utilized as a heat sinking mechanism and is contacted by one of the external leads. Presently most devices utilizing this configuration are formed by plastic or epoxy encapsulation and are therefore non-hermetically sealed.

One reason that plastic or epoxy encapsulation is utilized is that the leads penetrate the vertical wall of the package and extend over the pellet mounting surface. The presence of the leads extending over the pellet mounting surface makes it difficult to mount a semiconductor pellet. This difficulty arises since the device pellet is usually soldered to the pellet mounting surface at temperatures considerably lower than the temperatures needed for glass sealing the external leads in place. As a result the external leads almost always have to be mounted before the pellet to avoid reflowing the solder between the pellet and the pellet mounting surface. That is, if the device pellet were mounted first and the external leads affixed thereafter, the pellet would unsolder and probably shift its position during the comparatively higher temperature glass sealing process. As a result of these obstacles, most hermetic devices are fabricated utilizing other packages, such as, for example, the well known TO-3 package.

A novel package, embodying the principles of the present invention, results in a hermetically sealed package having the general configuration of the TO-220 package.

In the drawing:

FIG. 3 is a pictorial view, partially cut away, of another embodiment of a package, not drawn to scale, embodying the principles of the present invention.

FIG. 4 is a side view of the package shown in FIG. 3.

Figures 1, 2:
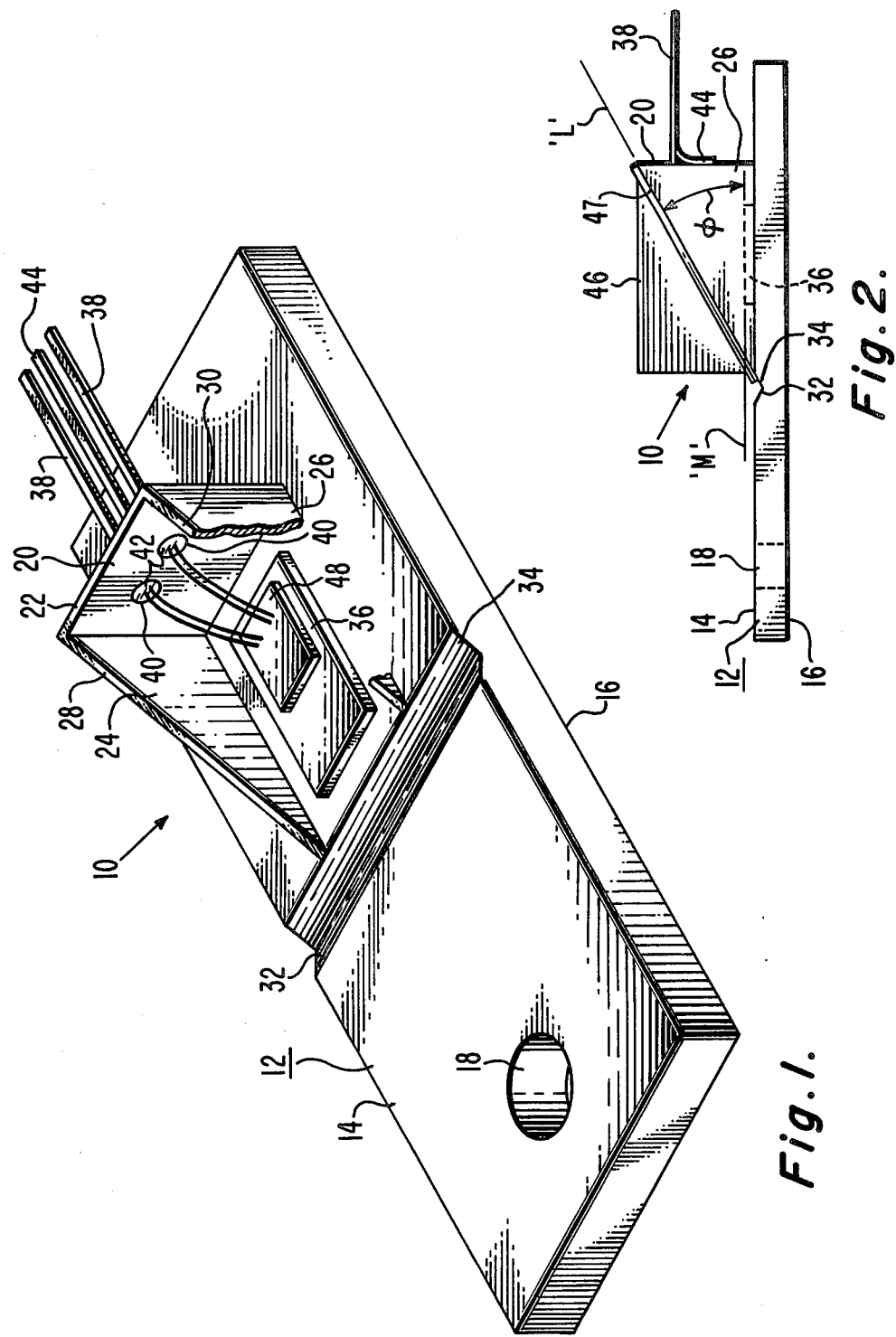
FIG. 1 is a pictorial view, partially cut away, of a novel package, not drawn to scale, embodying the principles of the present invention.
FIG. 2 is a side view of the package shown in FIG. 1.

One embodiment of a semiconductor device package, indicated generally at 10 in FIG. 1, embodying the principles of the present invention, comprises a base member 12 having first and second major opposing surfaces, 14 and 16, respectively. Preferably, the base member 12 is made of a thermally conductive material, such as steel, and has a hole or the like 18 integral therein for mounting the package 10 to another apparatus, such as a printed circuit board or a heat sinking mechanism. The base member 12 is also usually fairly uniform in thickness and has a substantially rectangular periphery although variations in thickness and peripheral shape can be used.

A first wall 20 extends substantially perpendicular to the first surface 14 of the base member 12. The height of the first wall 20 above the first surface 14 is ordinarily on the order of about 0.5 centimeters and has a thickness on the order of about 0.1 centimeters. The first wall 20 has a first lid receiving surface 22 associated therewith preferably located at the furthest extent from the first surface 14. The particular orientation of the first lid receiving surface 22 is more fully discussed below.

Second and third walls 24 and 26 respectively, extend substantially perpendicular to the first surface 14 and are preferably substantially parallel to each other. The second and third walls, 24 and 26 respectively, extend from the first wall 20 to form a generally U-shaped enclosure. Preferably the second and third walls 24 and 26 respectively, are also substantially perpendicular to the first wall 20. In addition, the second and third walls, 24 and 26 respectively, each have second and third lid receiving surface, 28 and 30 respectively, associated therewith. The orientation of the lid receiving surface is more fully explained below.

A fourth wall 32 extends between the second and third walls, 24 and 26 respectively, and is substantially parallel to the first wall 20. In this embodiment the fourth wall 32 extends into the base member 12 from the first surface 14 thereof. The fourth wall 32 has a fourth lid receiving surface 34 associated therewith which preferably lies in a plane substantially perpendicular to the fourth wall 32. In addition, the lid receiving surfaces, 22, 28, 30 and 34 associated with the four walls, 20, 24, 26 and 32, respectively, lie in a single geometric plane "L" (see FIG. 2) and preferably form a closed boundary.

The four walls 20, 24, 26 and 32 are preferably integral with the base member 12 and this part of the package 10 can be made by known coining or stamping methods. Alternatively, each of the four walls, 20, 24, 26 and 32, or subcombinations thereof can be formed separately and then welded or otherwise affixed to the base member 12.

As shown in FIG. 1 of the drawing, the second and third walls, 24 and 26 respectively, are generally triangular in shape and angularly extend from the top of the first wall 20 toward the bottom of the fourth wall 32 with respect to the base member 12.

A pellet mounting surface 36 is affixed to the first surface 14 of the base member 12 and lies in a second geometric plane "M" (see FIG. 2). The pellet mounting surface 36 is oriented such that the second geometric plane intersects the geometric plane "L" of the lid receiving surfaces, 22, 28, 30 and 34, at an included angle φ which is less than about 90°. As clearly shown in FIG. 2, in this embodiment the geometric plane "M" of pellet mounting surface 36 is substantially parallel to the first surface 14 of the base member 12 and is at an angle φ with respect to the geometric plane "L" containing the lid receiving surfaces, 22, 28, 30 and 34. Preferably, in this embodiment the included angle φ between the geometric planes, "L" and "M", is on the order of about 22.5°.

At least one, but preferably two, external leads 38 protrude through openings 40 in the first wall 20 and are hermetically mounted thereto. Preferably, the external leads 38 are mounted via a glass-to-metal seal 42 which is made utilizing methods known in the semiconductor packaging art. For example, by using any known compression sealing glass the glass-to-metal seal is formed at a temperature of about 1650° F. in a reducing atmosphere. In this embodiment, the leads 38 extend over the pellet mounting surface 36 on the inside of the first wall 20 and extend to about 2 cm. on the outside of the first wall 20.

When desired, a third external lead 44 can be attached to the first wall 20 and electrically connected to the base member 12. Preferably such a third external lead 44 is coplanar with the other two external leads 38. In addition, it is preferred that all of the leads, 38 and 44, be substantially parallel to but non-coplanar with, the base member 12.

As shown in FIG. 2, a lid 46 having a contact surface 47 which has substantially the same shape and size of the lid receiving surfaces 22, 28, 30 and 34 is hermetically sealed thereto via methods known in the art. For example, depending on the material, the contact surface 47 may be cold-sealed, i.e., utilizing high pressures without externally applied heat to form the hermetic seal or it may be welded.

One particular advantage of this embodiment is that the pellet mounting surface 36 is substantially parallel with the first surface 14 of the base member 12 and thus, during fabrication, a pellet 48 can be delivered to the pellet mounting surface 36 relatively easily by simply lifting the leads 38 protruding through the first wall 20 a sufficient amount to permit the pellet 48 to be slid thereunder. In addition, by being parallel to the plane of the first surface 14 of the base member 12, such a package 10 is easily integrated into present chip handling systems.

Another package, indicated generally at 50 in FIGS. 3 and 4 also embodying the principles of the present invention, similarly comprises a base member 52 having first and second major surfaces 54 and 56, respectively. Like the package 10 described above, the package 50 also has first, second, third and fourth walls, 58, 60, 62 and 64 respectively, protruding or extending substantially perpendicularly from the first surface 54 of the base member 52 and forming an enclosure. In this embodiment the fourth wall 64 extends from the first surface 54 a distance which is about the same as that of the first wall 58. Also as before, each of the four walls, 58, 60, 62 and 64, has a lid receiving surface 66, 68, 70 and 72 respectively, associated therewith, all of which lie in a single geometric plane "N", (see FIG. 4) such that when a lid 74 is attached thereto a hermetic seal is formed.

In this second embodiment a pellet mounting surface 76 is affixed to and integral with the first surface 54 of the base member 52 and lies in a geometric plane "O" (see FIG. 4) which intersects the geometric plane "N" containing the lid receiving surfaces, 66, 68, 70 and 72, at an included angle $\phi$ which is less than about 90°. Preferably the geometric plane "O" containing the pellet mounting surface 76 is oriented such that it extends above the fourth wall 64 of this package 50. Preferably, in this embodiment all four walls, 58, 60, 62 and 64, extend substantially the same distance above the base member 52 and thus the lid receiving surfaces, 66, 68, 70 and 72 respectively, associated therewith lie in a plane substantially parallel to the first surface 54 of the base member 52.

Advantageously, in this embodiment, the lid 74 utilized for sealing the second embodiment package 50 is preferably a flat piece of metal and is mounted substantially parallel to the first surface 54 of the base member 52.

External leads 78 extend through the first wall 58 in a fashion similar to that of the previously discussed package 10. In particular, the external leads 78 protrude through openings 80 in the first wall 58 and are affixed therethrough by a glass-to-metal seal 82. Likewise, a third external lead 84 can conductively contact the base member 52 of the package 50.

Although the third external lead 44 or 84, in both embodiments has been indicated throughout as electrically contacting the base member 12 or 52, respectively, this need not be the case. For example, the third external lead, 44 or 84 can contact a pellet 48 or 86 which is insulatingly affixed to the pellet mounting surface 36 or 76, respectively, by protruding, not shown, through the first wall, 20 or 58 respectively.

From the two embodiments presented above it can be easily understood that the height of the fourth wall 32 or 64 and the shape of the second and third walls, 24 and 26 or 60 and 62, can vary so long as the included angle $\phi$ of intersection between the geometric plane "M" or "O" of the pellet mounting surface 36 or 76 respectively, and the single geometric plane "L" or "N" containing the lid receiving surfaces 22, 28, 30 and 34 or 66, 68, 70 and 72, is less than about 90°.

While the specific examples presented refer to glass-to-metal seals 42 or 82 between the external leads, 38 or 78 respectively, and the first wall 20 or 58 respectively, thereof packages embodying the principles of the present invention are not intended to be so limited. For example, instead of forming a simple glass-to-metal seal between the external leads and the first wall the external leads can be initially glass sealed into an eyelet assembly (not shown) which can subsequently be soldered to the first wall.

Packages such as those described above, and others embodying the principles of the present invention, are advantageous since access is provided to the pellet mounting surface 36 or 76 from one side of the package, 10 or 50 respectively, after the external leads 38 or 78 are affixed. That is, because the geometric plane "M" or "O" of the pellet mounting surface, 36 or 76 respectively, intersects the geometric plane, "L" or "N" respectively, of the lid receiving surface, a semiconductor pellet 48 or 86 can be slid under the previously mounted external leads 38 or 78 respectively, onto the pellet mounting surface, 36 or 76 respectively. In addition, since the lid receiving surfaces, 22, 28, 30 and 34 or 66, 68, 70 and 72, all lie in a single geometric plane, "L" or "N" respectively, the lid 46 or 74 respectively, can be cold-welded, or attached in another fashion, by utilizing equal pressure on all edges of the lid 46 or 74 in single geometric plane "L" or "N", respectively. This is different from other configurations wherein cold-welding pressure is applied in more than one geometric plane. Further, such a package 10 or 50 permits the external leads, 38 or 78 respectively, to be hermetically sealed thereto using a comparatively higher temperature procedure, prior to the mounting of the semiconductor device pellet, 48 or 86 respectively, which usually is a comparatively lower temperature operation.

The resulting package 10 or 50 therefore is a hermetically sealed semiconductor device package which can be fabricated to almost any shape required. Although the packages 10 and 50 discussed herein have been shown to be generally of the TO-220 configuration, this is not intended to be so limiting as the principles of the present invention are applicable to almost any other device package configuration.

What is claimed is:
1. A semiconductor device package comprising:
   a base member having first and second sides and a pellet mounting surface on said first side;
   hermetic wall means extending from said base member on said first side;

a hermetic lid-receiving surface comprising a portion of said wall means;

said wall and lid-receiving surface together surrounding said pellet mounting surface in such a manner that hermetically sealing a hermetic lid to said lid-receiving surface will enclose said pellet mounting surface in a hermetically sealed container comprising said base member, said wall means and said lid;

said lid receiving surface lying in a first geometric plane;

said pellet mounting surface lying in a second geometric plane;

said first geometric plane and said second geometric plane intersecting at an included angle of less than 90°;

at least one electrically conductive lead passing through said wall means and hermetically sealed thereto;

a semiconductor device pellet having first and second surfaces and having said first surface thereof affixed to said pellet mounting surface; and said at least one electrically conductive lead connected to said second surface of said semiconductor pellet.

2. The semiconductor device package recited in claim 1 wherein:

said lid-receiving surface constitutes the periphery of a lid opening; and a portion of the intersection of said first geometric palne with said second geometric plane is within said lid opening.

3. The semiconductor device package recited in claim 2 wherein said pellet mounting surface is disposed to receive a pellet through said lid opening.

4. The semiconductor device package recited in claim 1 wherein said lid-receiving surface is substantially parallel to said first side of said base member.

5. The semiconductor device package recited in claim 1 wherein said pellet mounting surface is substantially parallel to said first side of said base member.

6. The semiconductor device package recited in claim 1 wherein said included angle between said first geometric plane and said second geometric plane is about 22.5°.

7. The semiconductor device package recited in claim 1 wherein said wall means is electrically conducting and said at least one lead is electrically insulated from said wall means.

8. The semiconductor device package recited in claim 7 further comprising at least one electrically conducting lead affixed to said wall means.

9. The semiconductor device package recited in claim 1 wherein said wall means comprises at least three substantially planar wall sections forming a continuous wall.

10. The semiconductor device package recited in claim 1 wherein said wall means comprises at least four substantially planar wall sections forming a continuous wall.

11. The semiconductor device package recited in claim 1 further comprising a hermetic lid hermetically sealed to said lid-receiving surface to enclose said pellet mounting surface within a hermetically sealed container.

12. The semiconductor device package recited in claim 1 wherein there is a substantial portion of said first side of said base member which will be outside said hermetically sealed container after said container is hermetically sealed.

13. The semiconductor device package recited in claim 12 wherein the portion of said base member which includes said substantial portion of said first side of said base member includes means for affixing said package to an addition structure.

14. The semiconductor device package recited in claim 1 wherein said pellet mounting surface is parallel to said first side of said base member.

15. The semiconductor device package recited in claim 14 wherein said pellet mounting surface is not co-planar with said first side of said base member.

16. The semiconductor device package recited in claim 1 wherein said pellet mounting surface is neither parallel to nor co-planar with said first side of said base member.

17. A semiconductor device package comprising:

a base member having first and second sides and a pellet mounting surface;

hermetic wall means extending from said base member on the same side as said pellet mounting surface;

a hermetic lid-receiving surface comprising a portion of said wall means;

said wall and lid-receiving surface together surrounding said pellet mounting surface in such a manner that hermetically sealing a hermetic lid to said lid-receiving surface will enclose said pellet mounting surface in a hermetically sealed container comprising said base member, said wall means and said lid;

said lid receiving surface lying in a first geometric plane;

said pellet mounting surface lying in a second geometric plane;

said first geometric plane and said second geometric plane intersecting at an included angle of less than 90°;

a semiconductor pellet having first and second surfaces; and said first surface of said pellet bonded to said pellet mounting surface.

18. The semiconductor device package recited in claim 17 further comprising
at least one electrically conductive lead connected to said second surface of said pellet.

* * * * *